(12) United States Patent
Lee

(10) Patent No.: US 8,889,468 B2
(45) Date of Patent: Nov. 18, 2014

(54) METHOD AND STRUCTURE FOR THIN FILM TANDEM PHOTOVOLTAIC CELL

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 595 days.

(21) Appl. No.: 13/030,464

(22) Filed: Feb. 18, 2011

(65) Prior Publication Data

US 2011/0143487 A1    Jun. 16, 2011

Related U.S. Application Data

(62) Division of application No. 12/562,086, filed on Sep. 17, 2009, now abandoned.

(60) Provisional application No. 61/101,641, filed on Sep. 30, 2008.

(51) Int. Cl.
 H01L 21/203 (2006.01)
 (Continued)

(52) U.S. Cl.
 CPC .......... *H01L 31/076* (2013.01); *H01L 31/0322* (2013.01); *H01L 31/0687* (2013.01);
 (Continued)

(58) Field of Classification Search
 USPC ................................................ 136/252–265
 See application file for complete search history.

(56) References Cited

U.S. PATENT DOCUMENTS

| 4,239,553 A | 12/1980 | Barnett et al. |
| 4,488,948 A | 12/1984 | Larson et al. |

(Continued)

FOREIGN PATENT DOCUMENTS

| GB | 2332684 A | 6/1999 |
| WO | 2009/149204 A1 | 12/2009 |

(Continued)

OTHER PUBLICATIONS

Gee et al., A 35% Efficient GaAs/Silicon Mechanically Stacked, Multijunction Concentrator Solar Cell, 20th IEEE photovoltaic Specialist Conference, IEEE Publishing, New York, pp. 754-758 (1998).*

(Continued)

*Primary Examiner* — Jayne Mershon
(74) *Attorney, Agent, or Firm* — Kilpatrick Townsend & Stockton LLP

(57) ABSTRACT

A tandem photovoltaic cell. The tandem photovoltaic cell includes a bifacial top cell and a bottom cell. The top bifacial cell includes a top first transparent conductive oxide material. A top window material underlies the top first transparent conductive oxide material. A first interface region is disposed between the top window material and the top first transparent conductive oxide material. The first interface region is substantially free from one or more entities from the top first transparent conductive oxide material diffused into the top window material. A top absorber material comprising a copper species, an indium species, and a sulfur species underlies the top window material. A top second transparent conductive oxide material underlies the top absorber material. A second interface region is disposed between the top second transparent conductive oxide material and the top absorber material. The bottom cell includes a bottom first transparent conductive oxide material. A bottom window material underlies the first bottom transparent conductive oxide material. A bottom absorber material underlies the bottom window material. A bottom electrode material underlies the bottom absorber material. The tandem photovoltaic cell further includes a coupling material free from a parasitic junction between the top cell and the bottom cell.

20 Claims, 17 Drawing Sheets

(51) Int. Cl.
*H01L 31/0336* (2006.01)
*H01L 31/032* (2006.01)
*H01L 31/076* (2012.01)
*H01L 31/0687* (2012.01)
*H01L 31/18* (2006.01)
*H01L 31/0725* (2012.01)
*H01L 31/0296* (2006.01)

(52) U.S. Cl.
CPC ............. *Y02E 10/544* (2013.01); *Y02E 10/543* (2013.01); *H01L 31/1828* (2013.01); *Y02E 10/541* (2013.01); *H01L 31/0725* (2013.01); *Y02E 10/548* (2013.01); *H01L 31/0296* (2013.01)
USPC .................. 438/95; 438/85; 438/93; 438/94; 438/86

(56) References Cited

U.S. PATENT DOCUMENTS

| | | | |
|---|---|---|---|
| 4,658,086 A * | 4/1987 | McLeod et al. | 136/249 |
| 4,710,589 A | 12/1987 | Meyers et al. | |
| 4,782,377 A | 11/1988 | Mahan | |
| 4,996,108 A | 2/1991 | Divigalpitiya et al. | |
| 5,125,984 A | 6/1992 | Kruehler et al. | |
| 5,261,968 A | 11/1993 | Jordan | |
| 5,261,969 A | 11/1993 | Stanberry | |
| 5,397,401 A | 3/1995 | Toma et al. | |
| 5,501,744 A | 3/1996 | Albright et al. | |
| 5,536,333 A | 7/1996 | Foote et al. | |
| 5,578,503 A | 11/1996 | Karg et al. | |
| 5,665,175 A | 9/1997 | Safir | |
| 5,733,382 A | 3/1998 | Hanoka | |
| 5,834,331 A | 11/1998 | Razeghi | |
| 6,040,521 A | 3/2000 | Kushiya et al. | |
| 6,066,797 A | 5/2000 | Toyomura et al. | |
| 6,288,325 B1 | 9/2001 | Jansen et al. | |
| 6,310,281 B1 | 10/2001 | Wendt et al. | |
| 6,320,115 B1 | 11/2001 | Kataoka et al. | |
| 6,328,871 B1 | 12/2001 | Ding et al. | |
| 6,350,946 B1 | 2/2002 | Miyake et al. | |
| 6,548,751 B2 | 4/2003 | Sverdrup et al. | |
| 7,141,863 B1 | 11/2006 | Compaan et al. | |
| 7,855,089 B2 | 12/2010 | Farris, III et al. | |
| 7,863,074 B2 | 1/2011 | Wieting | |
| 7,910,399 B1 | 3/2011 | Wieting | |
| 8,232,134 B2 | 7/2012 | Lee | |
| 8,586,457 B1 * | 11/2013 | Liang et al. | 438/509 |
| 8,652,870 B2 * | 2/2014 | Liang | 438/95 |
| 8,709,861 B2 * | 4/2014 | Liang | 438/95 |
| 2002/0026955 A1 | 3/2002 | Ouchida et al. | |
| 2002/0038663 A1 * | 4/2002 | Zenko et al. | 136/244 |
| 2003/0079772 A1 | 5/2003 | Gittings et al. | |
| 2003/0227017 A1 | 12/2003 | Yasuno | |
| 2005/0056312 A1 | 3/2005 | Young et al. | |
| 2005/0109392 A1 | 5/2005 | Hollars | |
| 2005/0150542 A1 | 7/2005 | Madan | |
| 2006/0037641 A1 | 2/2006 | Kibbel et al. | |
| 2006/0130890 A1 | 6/2006 | Hantschel et al. | |
| 2006/0180197 A1 | 8/2006 | Gui et al. | |
| 2006/0220059 A1 | 10/2006 | Satoh et al. | |
| 2007/0089782 A1 | 4/2007 | Scheuten et al. | |
| 2007/0151596 A1 | 7/2007 | Nasuno et al. | |
| 2007/0160770 A1 | 7/2007 | Stanberry | |
| 2007/0169810 A1 | 7/2007 | Van Duren et al. | |
| 2008/0023059 A1 | 1/2008 | Basol | |
| 2008/0041446 A1 | 2/2008 | Wu et al. | |
| 2008/0092945 A1 | 4/2008 | Munteanu et al. | |
| 2008/0092953 A1 | 4/2008 | Lee | |
| 2008/0173390 A1 | 7/2008 | Narasimhan et al. | |
| 2008/0216885 A1 | 9/2008 | Frolov et al. | |
| 2009/0020149 A1 | 1/2009 | Woods et al. | |
| 2009/0194165 A1 | 8/2009 | Murphy et al. | |
| 2009/0301562 A1 | 12/2009 | Lee | |
| 2009/0308437 A1 * | 12/2009 | Woods et al. | 136/255 |
| 2010/0051090 A1 | 3/2010 | Lee | |
| 2010/0078059 A1 | 4/2010 | Lee | |
| 2010/0099214 A1 | 4/2010 | Buquing | |
| 2010/0132775 A1 | 6/2010 | Le et al. | |
| 2010/0229921 A1 | 9/2010 | Farris, III et al. | |
| 2010/0236610 A1 | 9/2010 | Stancel et al. | |
| 2010/0291758 A1 * | 11/2010 | Robinson et al. | 438/478 |
| 2010/0307552 A1 | 12/2010 | Kohnke et al. | |
| 2011/0017257 A1 | 1/2011 | Lee et al. | |
| 2011/0017298 A1 | 1/2011 | Lee | |
| 2011/0168245 A1 | 7/2011 | Lee | |
| 2012/0199065 A1 | 8/2012 | Wieting et al. | |
| 2012/0204939 A1 | 8/2012 | Lee et al. | |

FOREIGN PATENT DOCUMENTS

| | | |
|---|---|---|
| WO | 2009/158187 A1 | 12/2009 |
| WO | 2010/025291 A2 | 3/2010 |
| WO | 2010/039727 A1 | 4/2010 |
| WO | 2010/107705 A1 | 9/2010 |

OTHER PUBLICATIONS

Ellmer, K., et al., "Copper Indium Disulfide Solar Cell Absorbers Prepared in a One-Step Process by Reactive Magnetron Sputtering from Copper and Indium Targets", Thin Solid Films, 2002, vol. 413, pp. 92-97.

Gee, J. M., et al., "A 31%-Efficient GaAs/Silicon Mechanically Stacked, Multijunction Concentrator Solar Cell", 20th IEEE Photovoltaic Specialist Conference, IEEE Publishing, New York, NY, 1988, pp. 754-758.

International Search Report & Written Opinion of PCT Application No. PCT/US09/46161, date of mailing Jul. 27, 2009, 14 pages.

International Search Report & Written Opinion of PCT Application No. PCT/US2009/058829, date of mailing Nov. 25, 2009, 12 pages.

International Search Report & Written Opinion of PCT Application No. PCT/US2009/46802, mailed on Jul. 31, 2009, 11 pages total.

International Search Report and Written Opinion for PCT Application No. PCT/US2009/055243, mailed on Mar. 11, 2011, 12 pages.

International Search Report and Written Opinion for PCT Application No. PCT/US2010/27342, mailed on May 17, 2010, 13 pages.

Martil, I., et al., "Growth and physical properties of CuGaSe$_2$ thin films by r.f. sputtering", Journal of Materials Science Letter, 1990, vol. 19, pp. 237-240.

Meyers, P.V., et al., "Polycrystalline CdTe on CuInSe$_2$ Cascaded Solar Cells", Conference Record of the Twentieth IEEE Photovoltaic Specialists Conference, Las Vegas, NV, Sep. 26-30, 1988, pp. 1448-1451, vol. 2.

Onuma, Y., et al., "Preparation and Characterization of CuInS$_2$ Thin Films Solar Cells with Large Grain", Solar Energy Materials & Solar Cells, 2001, vol. 69, pp. 261-269.

Rostan, P., et al. "Formation of Transparent and Ohmic ZnO:Al/MoSe$_2$ Contacts for Bifacial Cu (In, Ga)Se$_2$ Solar Cells and Tandem Structures", Thin Solid Films, 2005, vol. 480-481, pp. 67-70.

Schorr, S., et al., "Electronic Band Gap of $Zn_{2x}$ $(CuIn)_{1-x}$ $X_2$ Solid Solution Series (X=S, Se, Te)", Journal of Alloys and Compounds, 2006, vol. 414, No. 1-2, pp. 26-30.

Symko-Davies, "NREL High-Performance Photovoltaic Project Kickoff Meeting, Identifying Critical Pathways", Oct. 18, 2001, 121 pages.

Wu, X., et al. "13.9%-Efficient CdTe Polycrystalline Thin-Film Solar Cells with an Infrared Transmission of ~ 50%", Progress in Photovoltaics: Research and Applications, 2006, vol. 14, pp. 471-483.

Young, D. L., et al. "Interconnect Junctions for Thin-Film Tandem Solar Cells", Proceedings of the 3rd World Conference on Photovoltaic Energy Conversion, Osaka, Japan, May 11, 2003, vol. 1, pp. 27-30.

* cited by examiner

METHOD AND STRUCTURE FOR THIN FILM TANDEM PHOTOVOLTAIC CELL

CROSS-REFERENCES TO RELATED APPLICATIONS

This application is a division of U.S. Non-Provisional application Ser. No. 12/562,086, filed Sep. 17, 2009, which claims priority to U.S. Provisional Application No. 61/101,641, filed Sep. 30, 2008, which is commonly assigned and hereby incorporated by reference in its entirety herein for all purpose.

This application is related to Provisional Application No. 61/101,642 filed Sep. 30, 2008, commonly assigned, and hereby incorporated by reference herein for all purpose. This application is also related to PCT Application No.: PCT/US09/46161 filed Jun. 3, 2009, commonly assigned, and hereby incorporated by reference herein for all purpose.

BACKGROUND OF THE INVENTION

The present invention relates generally to photovoltaic materials and manufacturing method. More particularly, the present invention provides a method and structure for a thin film tandem photovoltaic cells. Merely by way of example, the present method and structure include absorber materials comprising copper indium disulfide species.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming a photovoltaic cell is provided. More particularly, the present invention provides a method and structure for forming thin film tandem photovoltaic cell. Merely by way of example, embodiments according to the present invention have been implemented using thin film semiconductor material. But it would be recognized that embodiments according to the present invention can have a much broader range of applicability.

In a specific embodiment, a tandem photovoltaic cell is provided. The tandem photovoltaic cell includes a top cell. The top cell is a bifacial cell in a specific embodiment. The top cell includes a top first transparent conductive oxide material. A top window material underlies the top first transparent conductive oxide material. In a specific embodiment, the top cell includes a first interface region disposed between the top window material and the top first transparent conductive oxide material. The first interface region is substantially free from one or more entities from the top first transparent conductive oxide material being diffused into the top window material. The top cell also includes a top absorber material underlying the top window material. The top absorber material comprise a copper species, an indium species, and a sulfur species in a specific embodiment. The top cell includes a top second transparent conductive oxide material underlying the top absorber material and a second interface region disposed between the top second transparent conductive oxide material and the top absorber material. The second interface region is substantially free from one or more entities from the top first transparent conductive oxide material being diffused into the top absorber material.

The tandem photovoltaic includes a bottom cell. The bottom cell includes a bottom first transparent conductive oxide material. A bottom window material underlies the first bottom transparent conductive oxide material. In a specific embodiment, a bottom absorber material is provided underlying the bottom window material and a bottom electrode material is provided underlying the bottom absorber material. In a specific embodiment, a coupling material is disposed between the top cell and the bottom cell. The coupling material is free from a parasitic junction between the top cell and the bottom cell in a preferred embodiment.

In an alternative embodiment, an alternative tandem photovoltaic cell is provided. The alternative tandem photovoltaic cell includes a top cell. The top cell is a bifacial cell in a specific embodiment. The top cell includes a top first transparent conductive oxide material. A top window material underlies the top first transparent conductive oxide material. The top cell also includes a top absorber material underlying the top window material. The top absorber material comprise a copper species, an indium species, and a sulfur species in a specific embodiment. The top cell includes a top second transparent conductive oxide material underlying the top absorber material.

The alternative tandem photovoltaic includes a bottom cell. The bottom cell includes a bottom first transparent conductive oxide material. A bottom window material underlies the first bottom transparent conductive oxide material. In a specific embodiment, a bottom absorber material is provided underlying the bottom window material and a bottom electrode material is provided underlying the bottom absorber material. In a specific embodiment, a coupling material is disposed between the top cell and the bottom cell. The coupling material is free from a parasitic junction between the top cell and the bottom cell in a preferred embodiment.

In a specific embodiment, a method of forming a tandem photovoltaic cell is provided. The method includes forming a bifacial top cell. The bifacial top cell is formed by providing a top first transparent conductive oxide material. A top window material is formed underlying the top first transparent conductive oxide material. In a specific embodiment, the method forms a first interface region between the top window material and the top first transparent conductive oxide material. In a specific embodiment, the first interface region is substantially free diffusion of from one or more entities from the top first transparent conductive oxide material into the top window material. The method forms a top absorber material underlying the top window material. The top absorber material includes a copper species, an indium species, and a sulfur species in a specific embodiment. A top second transparent conductive oxide material is formed underlying the top absorber material. The method includes forming a second interface region between the top second transparent conductive oxide material and the top absorber material for the bifacial top cell. The second interface region is substantially free from one or more entities from the top first transparent conductive oxide material diffused into the top absorber material in a preferred embodiment. The method includes forming a bottom cell. The bottom cell is formed by providing a bottom first transparent conductive oxide material and forming a bottom window material underlying the first bottom transparent conductive oxide material. A bottom absorber material is formed underlying the bottom window material. A bottom electrode material is formed underlying the bottom absorber material to form the bottom cell. In a specific embodiment, the method provides a coupling material disposed between the top bifacial cell and the bottom cell. Preferably, the coupling material provides for a junction free from parasitic potential between the top bifacial cell and the bottom cell.

Many benefits can be achieved by ways of the embodiments according to the present invention. For example, the thin film tandem photovoltaic cell can be fabricated using techniques without substantial modification to the conventional equipment. Additionally the present thin film tandem photovoltaic cell has an improved conversion efficiency compared to a conventional photovoltaic cell and provides a cost effective way to convert sunlight into electric energy. Depending on the embodiment, one or more of these benefits may be achieved. These and other benefits will be described in more detailed throughout the present specification and particularly below.

DETAILED DESCRIPTION OF THE INVENTION

According to embodiments of the present, a method and a structure for forming a photovoltaic cell are provided. More particularly, embodiments according to the present invention provide a method and structure for forming a thin film tandem photovoltaic cell. Merely by way of example, embodiments according to the present invention have been implemented using thin film semiconductor material. But it would be recognized that embodiments according to the present invention can have a much broader range of applicability.

Figure 1:
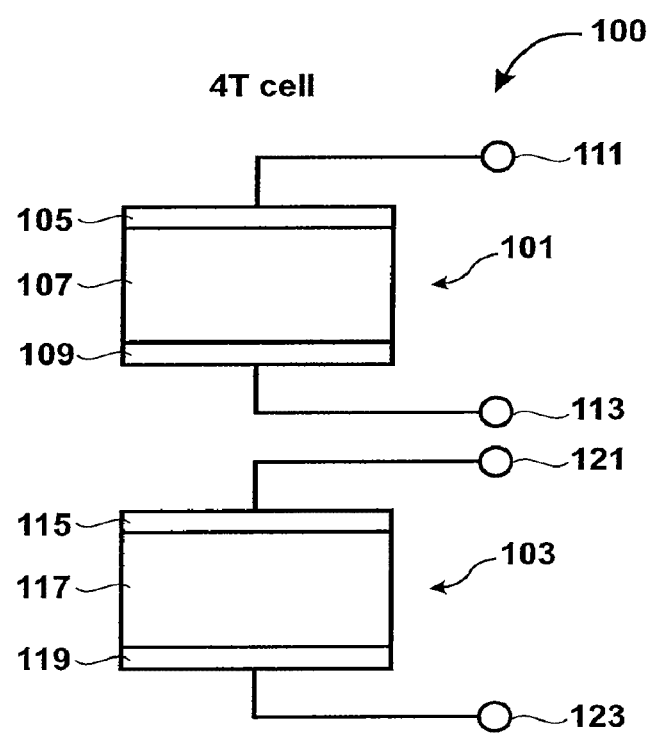
FIG. 1 is a simplified diagram of a tandem photovoltaic cell according to an embodiment of the present invention.

FIG. 1 is a simplified diagram of a tandem photovoltaic cell according to an embodiment of the present invention. The diagram is merely an illustration and should not unduly limit the scope of the claims herein. One of ordinary skill in the art would recognize other variations, modifications, and alternatives. As an example, the tandem photovoltaic cell can also be described in U.S. Provisional No. 61/092,732, commonly assigned, and hereby incorporated by reference herein. As shown, a four terminal tandem photovoltaic cell device 100 is provided. The four terminal tandem photovoltaic cell includes a lower cell 103 and an upper cell 101 operably coupled to the lower cell. The terms "lower" and "upper" are not intended to be limiting but should be construed by plain meaning by one of ordinary skill in the art. In general, the upper cell is closer to a source of electromagnetic radiation than the lower cell, which receives the electromagnetic radiation after traversing through the upper cell. Of course, there can be other variations, modifications, and alternatives.

In a specific embodiment, the lower cell includes a lower glass substrate material 119, e.g., a transparent glass material. The lower cell also includes a lower electrode layer made of a reflective material overlying the lower glass substrate material. The lower cell includes a lower absorber layer overlying the lower electrode layer. As shown, the absorber and electrode layer are illustrated by reference numeral 117. In a specific embodiment, the absorber layer is made of a semiconductor material having a band gap energy Eg in a range of about 1.2 eV to about 2.2 eV and preferably in a range of about 1.6 eV to about 1.9 eV, but can be others. In a specific embodiment, the lower cell includes a lower window layer overlying the lower absorber layer and a lower transparent conductive oxide layer 115 overlying the lower window layer.

In a specific embodiment, the upper cell includes a p+ type transparent conductor layer 109 overlying the lower transparent conductive oxide layer. In a preferred embodiment, the p+ type transparent conductor layer is characterized by a sheet resistance of less than or equal to about 10 Ohms/square centimeters and an optical transmission of 90 percent and greater. In a specific embodiment, the upper cell has an upper p type absorber layer overlying the p+ type transparent conductor layer. In a preferred embodiment, the p type conductor layer made of a semiconductor material has a band gap energy Eg in a range of about 1.2 eV to about 2.2 eV and preferably in a range of about 1.6 eV to about 1.9 eV, but can be others. The upper cell also has an upper n type window layer overlying the upper p type absorber layer. Referring again to FIG. 1, the window and absorber layer for the upper cell are illustrated by reference numeral 107. The upper cell also has an upper transparent conductive oxide layer 105 overlying the upper n type window layer and an upper glass material (not shown) overlying the upper transparent conductive oxide layer. Of course, there can be other variations, modifications, and alternatives.

In a specific embodiment, the tandem photovoltaic cell includes four terminals. The four terminals are defined by reference numerals 111, 113, 121, and 123. Alternatively, the tandem photovoltaic cell can also include three terminals, which share a common electrode preferably proximate to an interface region between the upper cell and the lower cell. In other embodiments, the multi junction cell can also include two terminals, among others, depending upon the application. Examples of other cell configurations are provided in U.S. Provisional Patent Application No. 61/092,383, commonly assigned and hereby incorporated by reference herein. Of course, there can be other variations, modifications, and alternatives. Further details of the four terminal cell can be found throughout the present specification and more particularly below.

Figure 2:
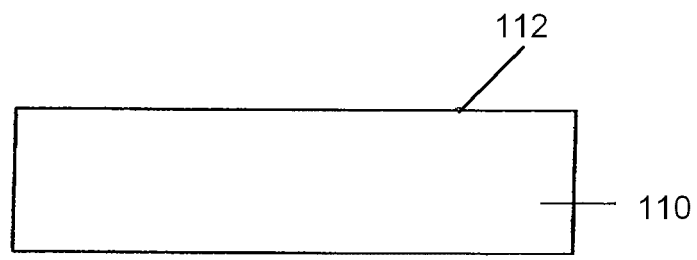
FIGS. 2 through 9 are schematic diagrams illustrating a method and structure for forming a thin film photovoltaic device according to an embodiment of the present invention.

FIG. 2-17 are a schematic diagrams illustrating a method for forming a top cell for a thin film tandem photovoltaic device according to an embodiment of the present invention. These diagrams are merely examples, which should not unduly limit the claims herein. One skilled in the art would recognize other variations, modifications, and alternatives. As shown in FIG. 2, a substrate 110 is provided. In an embodiment, the substrate includes a surface region 112 and is held in a process stage within a process chamber (not shown). In another embodiment, the substrate is an optically transparent solid material. For example, the substrate can be a glass, quartz, fused silica, or a plastic, or metal, or foil, or semiconductor, or other composite materials. Depending upon the embodiment, the substrate can be a single material, multiple materials, which are layered, composites, or stacked, including combinations of these, and the like. Of course, there can be other variations, modifications, and alternatives.

Figure 3:
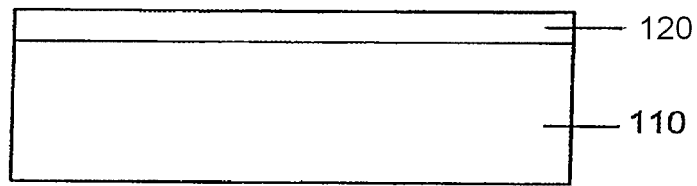

As shown in FIG. 3, the method includes forming a first electrode layer 120 overlying the surface region of the substrate. The first electrode layer can be formed using a suitable metal material such as molybdenum, or tungsten, but can be others. These other metal materials may include copper, chromium, aluminum, nickel, platinum, or others. Such metal material can be deposited using techniques such as sputtering, evaporation (e.g., electron beam), electro plating, combination of these and the like in a specific embodiment. A thickness of the first electrode layer can range from about 100 nm to 2 micron, but can be others. First electrode layer 120 is preferably characterized by a resistivity of about 10 Ohm/cm2 and less according to a specific embodiment. In a preferred embodiment, the electrode layer is provided by molybdenum. In a specific embodiment, the first electrode layer may be provided using a transparent conductive oxide (TCO) material such as $In_2O_3$:Sn (ITO), ZnO:Al (AZO), SnO2:F (TFO), but can be others. Of course, there can be other variations, modifications and alternatives.

Figure 4:
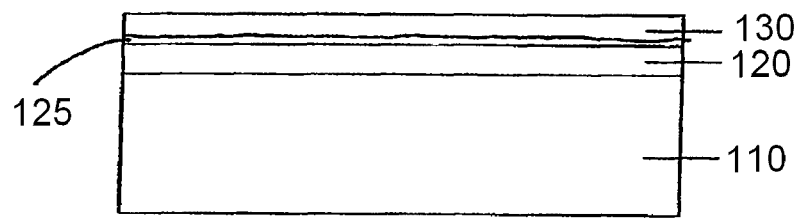

Referring to FIG. 4, the method for forming the thin film photovoltaic cell includes forming a copper layer 130 overlying the electrode layer formed. The copper layer can be formed using a sputtering process such as a DC magnetron sputtering process in a specific embodiment. The DC magnetron sputtering process may be provided at a deposition pressure of about 6.2 mTorr, controlled by using an inert gas such as argon. Such pressure can be achieved using a gas flow rate of about 32 sccm. The sputtering process can be perform at about room temperature without heating the substrate. Of course, minor heating of the substrate may be resulted due to the plasma generated during the deposition process. According to certain embodiments, a DC power in a range from 100 Watts to 150 Watts, and preferably about 115 Watts may be used, depending on the embodiment. A deposition time for a Cu layer of 330 nm thickness can be about 6 minutes or more. Of course, the deposition condition can be varied and modified according to a specific embodiment.

Depending on the embodiment, the method forms a barrier layer 125 overlying the electrode layer to form an interface region between the electrode layer and the copper layer. In a specific embodiment, the interface region is maintained substantially free from a metal disulfide layer having a semiconductor characteristic that is different from the copper indium disulfide material during later processing steps. Depending upon the embodiment, the barrier layer has suitable conductive characteristics and can be reflective to allow electromagnetic radiation to reflect back or can also be transparent or the like. In a specific embodiment, the barrier layer is selected from platinum, titanium, chromium, or silver. Of course, there can be other variations, modifications, and alternatives.

Figure 5:
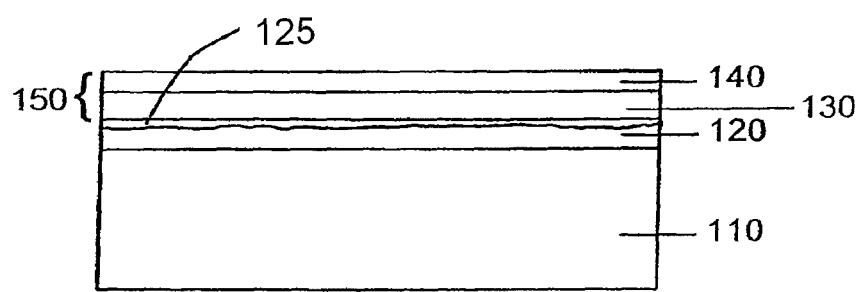
Figure 6:
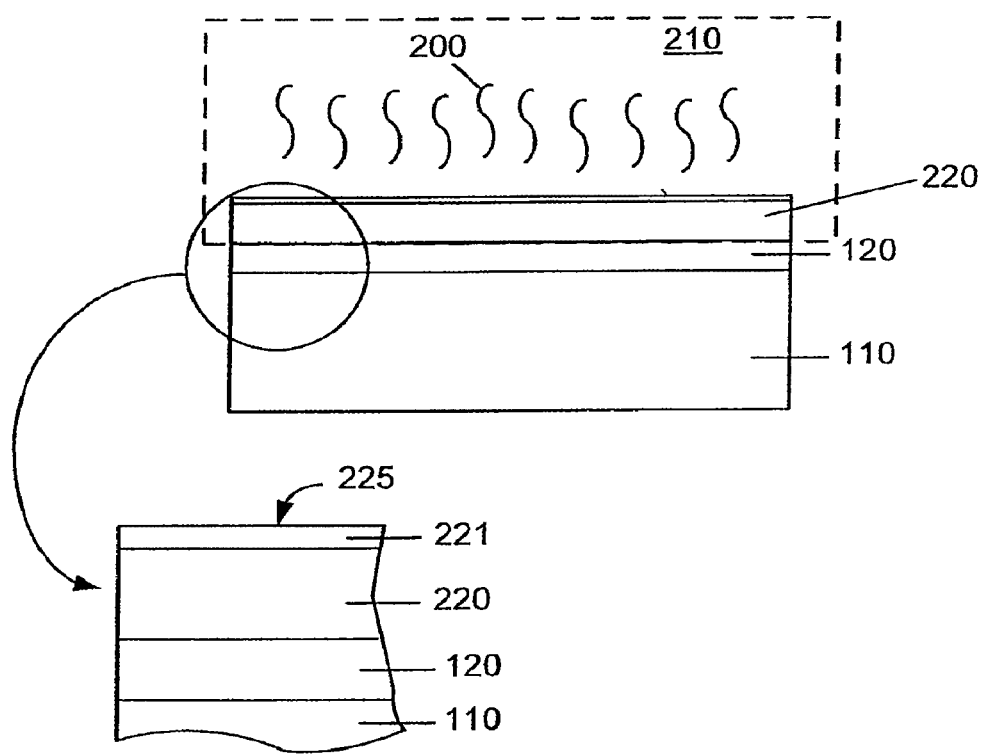

As shown in FIG. 5, the method includes providing an indium (In) layer 140 overlying the copper layer. In particular, the indium layer 140 is formed overlying the copper layer 130. The indium layer is deposited over the copper layer using a sputtering process. In one example, the indium layer is deposited using a DC magnetron sputtering process is under a similar process condition for depositing the Cu layer. The deposition time for the indium layer may be shorter than that for Cu layer. For example, 2 minutes and 45 seconds may be sufficient for depositing an In layer of a thickness of about 410 nm according to a specific embodiment. Other suitable deposition methods such as electroplating or others may also be used depending on the embodiment.

In a specific embodiment, the copper layer and the indium layer form a multilayer structure for the thin film photovoltaic cell. In a specific embodiment, the copper layer and the indium layer are provided in a certain stoichiometry that forms a copper rich material having a copper to indium atomic ratio ranging from about 1.2:1 to about 2.0:1. In an alternative embodiment, the copper to indium atomic ratio ranges from about 1.35:1 to about 1.60:1. In another embodiment, the copper to indium atomic ratio is selected to be 1.55:1. In a preferred embodiment, the copper to indium atomic ratio provides a copper rich film for the photovoltaic cell. In another specific embodiment, the indium layer is deposited overlying the electrode layer prior to the deposition of the copper layer. Of course there can be other variations, modifications, and alternatives.

As shown in FIG. 5, the multilayered structure 150 comprising at least an indium layer and a copper layer is subjected to a thermal treatment process 200 in an sulfur species 210 bearing environment. The thermal treatment process uses a rapid thermal process while the multilayer structure is subjected to the sulfur bearing species. In a specific embodiment, the rapid thermal process uses a temperature ramp rate ranging from about 10 Degrees Celsius/second to about 50 Degrees Celsius/second to a final temperature ranging from about 400 Degrees Celsius to about 600 Degrees Celsius. In a specific embodiment, the thermal treatment process further maintains at the final temperature for a dwell time ranging from about 1 minute to about 10 minutes, but can be others. The thermal treatment process also includes a temperature ramp down in an inert ambient or other suitable environment. The inert ambient can be provided using gases such as nitrogen, argon, helium, and others, which stops reaction to alloy the metal material with the sulfur species. Further details of the temperature ramp process is described throughout the present specification and more particularly below.

In a specific embodiment, the sulfur bearing species can be applied using a suitable technique. In an example, the sulfur bearing species are in a fluid phase. As an example, the sulfur can be provided in a solution, which has dissolved $Na_2S$, $CS_2$, $(NR_4)_2S$, thiosulfate, and others. Such fluid based sulfur species can be applied overlying one or more surfaces of the multilayered copper/indium structure according to a specific embodiment. In another example, the sulfur bearing species 210 is provided by hydrogen sulfide gas or other like gas. In other embodiments, the sulfur can be provided in a solid phase, for example elemental sulfur. In a specific embodiment, elemental sulfur can be heated and allowed to vaporize into a gas phase, e.g., $S_n$, and allowed to react with the indium/copper layers. Other sulfur bearing species may also be used depending on the embodiment. Taking hydrogen sulfide gas as the sulfur bearing species as an example. The hydrogen sulfide gas can be provided using one or more entry valves with flow rate control into a process chamber. Any of these application techniques and other combinations of techniques can also be used. The process chamber may be equipped with one or more pumps to control process pressure. Depending on the embodiment, a layer of sulfur material may be provided overlying the multilayer structure comprising the copper layer and the indium layer. The layer of sulfur material can be provided as a patterned layer in a specific embodiment. In other embodiments, sulfur material may be provided in a slurry, a powder, a solid, a paste, a gas, any combination of these, or other suitable form. Of course, there can be other variations, modifications, and alternatives.

Referring again to FIG. 6, the thermal treatment process cause a reaction between copper indium material within the multilayered structure and the sulfur bearing species 210, thereby forming a layer of copper indium disulfide thin film material 220. In one example, the copper indium disulfide material is formed by incorporating sulfur ions and/or atoms evaporated or decomposed from the sulfur bearing species into the multilayered structure with indium atoms and copper atoms mutually diffused therein. In a specific embodiment, the thermal treatment process results in a formation of a cap layer overlying the copper indium disulfide material. The cap layer comprises a thickness of substantially copper sulfide material 221 substantially free of indium atoms. The copper sulfide material 221 includes a surface region 225. In a specific embodiment, the formation of the copper sulfide cap layer is under a Cu-rich conditions for the Cu—In bearing multilayered structure 150. Depending on the embodiment, the thickness of the copper sulfide material is in an order of about five to ten nanometers and greater depending on the multilayered structure. In a specific embodiment, thermal treatment process allows the first electrode layer using a TCO material to maintain at a sheet resistance of less than or equal to about 10 Ohms per square centimeters and an optical transmission of 90 percent and greater after the copper indium disulfide thin film material is formed. Of course, there can be other variations, modifications, and alternatives.

Figure 7:
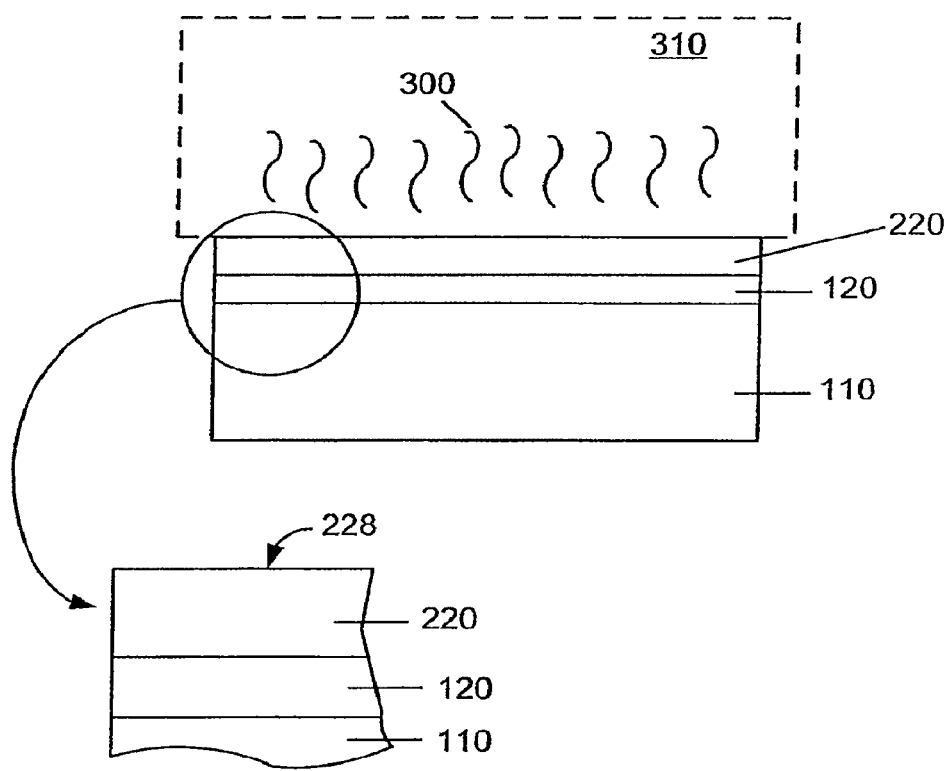
Figure 8:
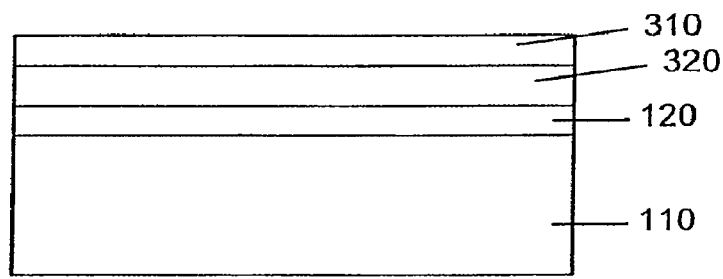

As shown in FIG. 7, copper sulfide material 221 is subjected to a dip process 300. The copper sulfide material overlies copper indium disulfide thin film 220. The dip process is performed by exposing the surface region of the copper sulfide material to about a solution comprising a 10% by weight of potassium cyanide 310 according to a specific embodiment. Potassium cyanide solution provides an etching process to selectively remove copper sulfide material 221 from the copper indium disulfide material surface exposing a surface region 228 of underlying copper indium disulfide material according to a specific embodiment. In a preferred embodiment, the etch process has a selectivity of about 1:100 or more between copper sulfide and copper indium disulfide. Other etching species can be used depending on the embodiment. In a specific embodiment, the etching species can be hydrogen peroxide. In other embodiments, other etching techniques including electro-chemical etching, plasma etching, sputter-etching, or any combination of these may be used. In a specific embodiment, the copper sulfide material can be mechanically removed, chemically removed, electrically removed, or any combination of these, and others. In a specific embodiment, the absorber layer made of copper indium disulfide can have a thickness ranging from about one micron to about 10 microns, but can be others. Of course, there can be other variations, modifications, and alternatives.

In a specific embodiment, the copper indium disulfide film has a p type impurity characteristics. In certain embodiments, the copper indium disulfide material is further subjected to a doping process to adjust a p-type impurity density therein to optimize an I-V characteristic of the high efficiency thin film photovoltaic devices. For example, the copper indium disulfide material may be doped using an aluminum species. In another example, the copper indium disulfide material can be intermixed with a copper indium aluminum disulfide material to form the absorber layer. Of course, there can be other variations, modifications, and alternatives.

Referring again to FIG. 8, the method includes forming a window layer 310 overlying the copper indium disulfide material, which has a p-type impurity characteristics. The window layer can be selected from a group of materials consisting of a cadmium sulfide (CdS), a zinc sulfide (ZnS), zinc selenium (ZnSe), zinc oxide (ZnO), zinc magnesium oxide (ZnMgO), or others. These material may be doped with a suitable impurities to provide for a n+ type impurity characteristic. The window layer and the absorber layer forms an interface region for a PN-junction associated with a photovoltaic cell. The window layer is heavily doped to form a n+-type semiconductor layer. In one example, indium species are used as the doping material for a CdS window layer to cause formation of the n+-type characteristic associated with the window layer. In certain embodiments, ZnO may be used as the window layer. ZnO can be doped with an aluminum species to provide for the n+ impurity characteristics. Depending on the material used, the window layer can range from about 200 nanometers to about 500 nanometers. Of course, there can be other variations, modifications, and alternative.

Figure 9:
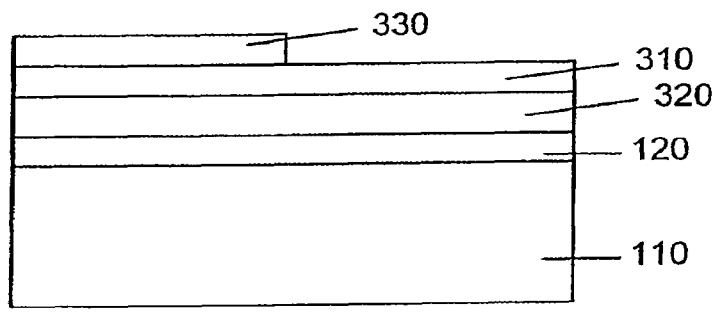

As shown in FIG. 9, a conductive layer 330 is form overlying a portion of a surface region of the window layer. Conductor layer 330 provides a top electrode layer for the thin film photovoltaic cell. In one embodiment, conductive layer 330 is a transparent conductive oxide (TCO). For example, the transparent conductive oxide can be selected from a group consisting of $In_2O_3$:Sn (ITO), ZnO:Al (AZO), SnO2:F (TFO), but can be others. In a specific embodiment, the TCO layer is patterned to maximize the efficiency of the thin film photovoltaic devices. In certain embodiments, the TCO layer can also function as a window layer, which eliminates the need of a separate window layer. Of course there can be other variations, modifications, and alternatives.

Figure 10:
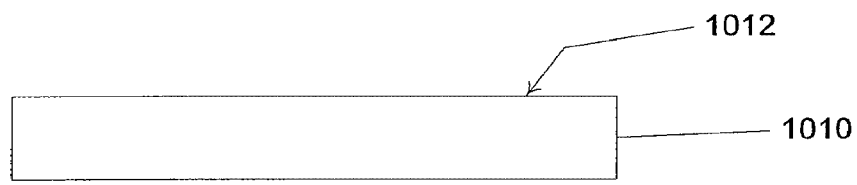
FIGS. 10 through 17 are schematic diagrams illustrating a method and structure for forming a thin film photovoltaic device according to an embodiment of the present invention.

FIG. 10 through 17 are simplified diagrams illustrating a method to form a photovoltaic cell in a superstrate configuration for the thin film tandem photovoltaic cell according to an alternative embodiment of the present invention. These diagrams are merely examples and should not unduly limit the scope of the claims herein. One skilled in the art would recognize other variations, modifications, and alternatives. As shown in FIG. 10, a substrate 1010 is provided. In an embodiment, the substrate includes a surface region 1012 and is held in a process stage within a process chamber (not shown). In a specific embodiment, the transparent substrate is an optically transparent solid material. For example, the optically transparent solid material can be glass, quartz, fused silica, or a polymer material. Other material such as metal, or foil, or semiconductor, or other composite materials may also be used in other embodiments. Depending upon the embodiment, the substrate can be a single material, multiple materials, which are layered, composites, or stacked, including combinations of these, and the like. Of course there can be other variations, modifications, and alternatives.

Figure 11:
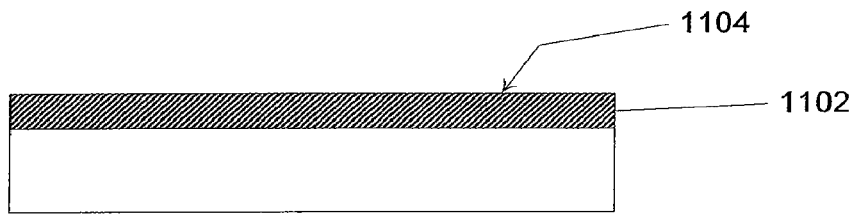

As shown in FIG. 11, the method includes forming a first electrode layer 1102 including a electrode surface region overlying the surface region of the substrate. The first electrode layer is preferably made of a transparent conductive oxide, commonly called TCO. For example, the transparent conductive oxide can be selected from a group consisting of $In_2O_3$:Sn (ITO), ZnO:Al (AZO), SnO2:F (TFO), but can be others. In a specific embodiment, the TCO layer is patterned to maximize the efficiency of the thin film photovoltaic devices. A thickness of the electrode layer can range from about 100 nm to 2 micron, but can be others. Electrode layer 120 is preferably characterized by a resistivity of less than about 100 nm/cm$^2$ according to a specific embodiment. Of course there can be other variations, modifications, and alternatives.

Figure 12:

In a specific embodiment, the method includes forming a window layer 1202 overlying the first electrode layer as shown in FIG. 12. The window layer can be selected from a group of materials consisting of a cadmium sulfide (CdS), a zinc sulfide (ZnS), zinc selenium (ZnSe), zinc oxide (ZnO), zinc magnesium oxide (ZnMgO), or others. These material may be doped with a suitable impurities to provide for a n+ type impurity characteristic. In one example, indium species are used as the doping material for a CdS window layer to cause formation of the n+-type characteristic associated with the window layer. In certain embodiments, ZnO may be used as the window layer. ZnO can be doped with an aluminum species to provide for the n+ impurity characteristics. Depending on the material used, the window layer can range from about 200 nanometers to about 500 nanometers. Of course, there can be other variations, modifications, and alternative.

Figure 13:
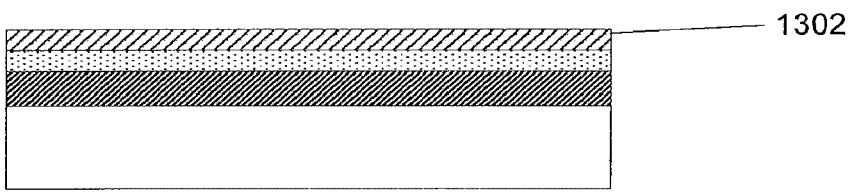

Referring to FIG. 13, the method includes providing a copper layer 1302 overlying the window layer. The copper layer can be formed using a sputtering process such as a DC magnetron sputtering process in a specific embodiment. The DC magnetron sputtering process may be provided at a deposition pressure of about 6.2 mTorr, controlled by using an inert gas such as argon. Such pressure can be achieved using a gas flow rate of about 32 sccm. The sputtering process can be perform at about room temperature without heating the substrate. Of course, minor heating of the substrate may be resulted due to the plasma generated during the deposition process. According to certain embodiments, a DC power in a range from 100 Watts to 150 Watts, and preferably about 115 Watts may be used, depending on the embodiment. As merely an example, a deposition time for a Cu layer of 330 nm thickness can be about 6 minutes or more. Of course, the deposition condition can be varied and modified according to a specific embodiment.

Figure 14:
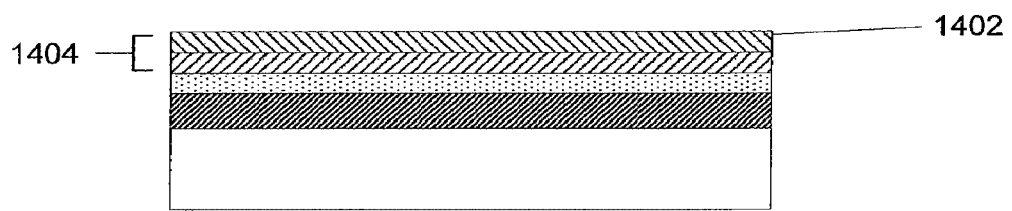

As shown in FIG. 14, the method includes providing an indium (In) layer 1402 overlying the copper layer. The indium layer is deposited over the copper layer using a sputtering process in a specific embodiment. In one example, the indium layer is deposited using a DC magnetron sputtering process is under a similar process condition for depositing the Cu layer. The deposition time for the indium layer may be shorter than that for Cu layer. For example, 2 minutes and 45 seconds may be sufficient for depositing an In layer of a thickness of about 410 nm according to a specific embodiment. Other suitable deposition methods such as electroplating or others may also be used depending on the embodiment.

In a specific embodiment, the copper layer and the indium layer form a multilayer structure 1404 for the thin film photovoltaic cell. In a specific embodiment, the copper layer and the indium layer are provided in a certain stoichiometry that forms a copper rich material. In a specific embodiment, the copper rich material can have a copper to indium atomic ratio ranging from about 1.2:1 to about 2.0:1. In an alternative embodiment, the copper to indium atomic ratio ranges from about 1.35:1 to about 1.60:1. In another embodiment, the copper to indium atomic ratio is selected to be 1.55:1. In a preferred embodiment, the copper to indium atomic ratio provides a copper rich film for the photovoltaic cell. In another specific embodiment, the indium layer is deposited overlying the electrode layer prior to the deposition of the copper layer. Of course there can be other variations, modifications, and alternatives.

Figure 15:
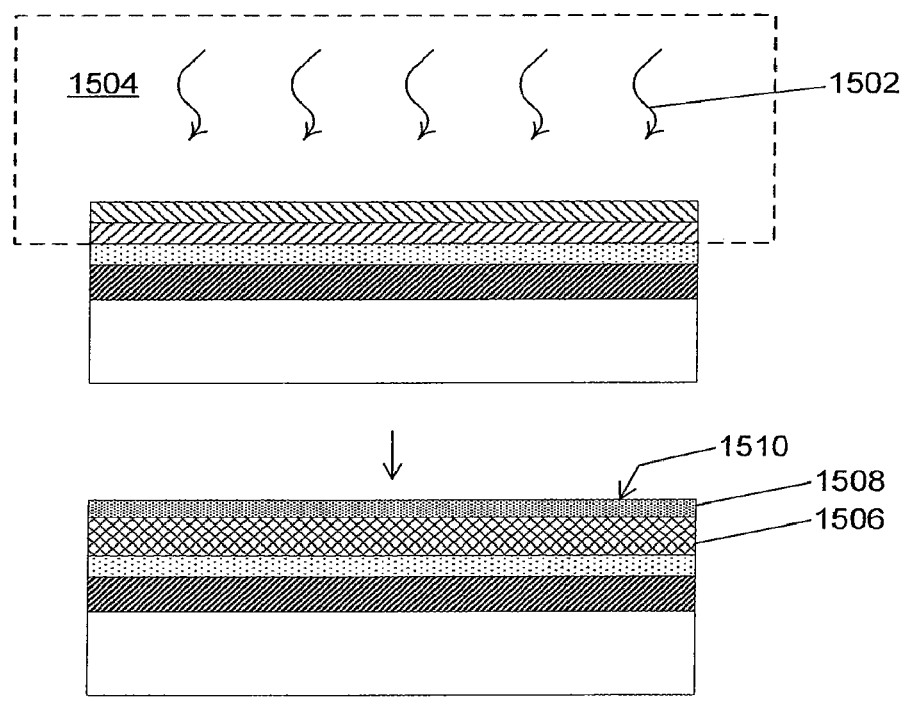

As shown in FIG. 15, the multilayered structure comprising at least an indium layer and a copper layer is subjected to a thermal treatment process 1502 in an sulfur species 1504 bearing environment. The thermal treatment process uses a rapid thermal process while the multilayer structure is subjected to the sulfur bearing species. In a specific embodiment, the rapid thermal process uses a temperature ramp rate ranging from about 10 Degrees Celsius/second to about 50 Degrees Celsius/second to a final temperature ranging from about 400 Degrees Celsius to about 600 Degrees Celsius. In a specific embodiment, the thermal treatment process further maintains at the final temperature for a dwell time ranging from about 1 minute to about 10 minutes, but can be others. The thermal treatment process also include a temperature ramp down in an inert ambient or other suitable environment that can stop the reaction of formation of the alloy material in a specific embodiment. The inert ambient can be provided using gases such as nitrogen, argon, helium, and others. Further details of the temperature ramp process is described throughout the present specification and more particularly below.

In a specific embodiment, the sulfur bearing species can be applied using a suitable technique. In an example, the sulfur bearing species are in a fluid phase. As an example, the sulfur can be provided in a solution, which has dissolved $Na_2S$, $CS_2$, $(NR_4)_2S$, thiosulfate, and others. Such fluid based sulfur species can be applied overlying one or more surfaces of the multilayered copper/indium structure according to a specific embodiment. In another example, the sulfur bearing species 210 is provided by hydrogen sulfide gas or other like gas. In other embodiments, the sulfur can be provided in a solid phase, for example elemental sulfur. In a specific embodiment, elemental sulfur can be heated and allowed to vaporize into a gas phase, e.g., $S_n$, and allowed to react with the indium/copper layers. Other sulfur bearing species may also be used depending on the embodiment. Taking hydrogen sulfide gas as the sulfur bearing species as an example. The hydrogen sulfide gas can be provided using one or more entry valves with flow rate control into a process chamber. Any of these application techniques and other combinations of techniques can also be used. The process chamber may be equipped with one or more pumps to control process pressure. Depending on the embodiment, a layer of sulfur material may be provided overlying the multilayer structure comprising the copper layer and the indium layer. The layer of sulfur material can be provided as a patterned layer in a specific embodiment. In other embodiment, sulfur material may be provided in a slurry, a powder, a solid, a paste, a gas, any combination of these, or other suitable form. Of course, there can be other variations, modifications, and alternatives.

In a specific embodiment, the thermal treatment process maintains the absorber layer substantially free from species that may diffuse from the window layer and/or the transparent conductive oxide layer. The method also eliminates using a thick window layer to protect the transparent conductive oxide layer from diffusion of species from the absorber layer. The method provides a photovoltaic cell that can have a conversion efficiency greater than about 8 percent or greater than 10 percent, and others. Of course, there can be other variations, modifications, and alternatives.

Referring again to FIG. 15, the thermal treatment process causes a reaction between copper and indium materials within the multilayered structure and the sulfur bearing species, thereby forming a layer of copper indium disulfide thin film material 1506. In one example, the copper indium disulfide thin film material is formed by incorporating sulfur ions and/or atoms evaporated or decomposed from the sulfur bearing species into the multilayered structure with indium atoms and copper atoms mutually diffused therein. In a specific embodiment, the thermal treatment process results in a formation of a cap layer overlying the copper indium disulfide material. The cap layer comprises a thickness of substantially copper sulfide material 1508 substantially free of indium atoms. The copper sulfide material includes a surface region 1510. In a specific embodiment, the formation of the copper sulfide cap layer is under a Cu-rich conditions for the Cu—In bearing multilayered structure. Depending on the embodiment, the thickness of the copper sulfide material is in an order of about five to ten nanometers and greater depending on the multilayered structure. In a specific embodiment, the thermal treatment process allows the first electrode layer to maintain at a sheet resistance of less than or equal to about 10 Ohms per square centimeters and an optical transmission of 90 percent and greater after the copper indium disulfide thin film material is formed. Of course, there can be other variations, modifications, and alternatives.

Figure 16:
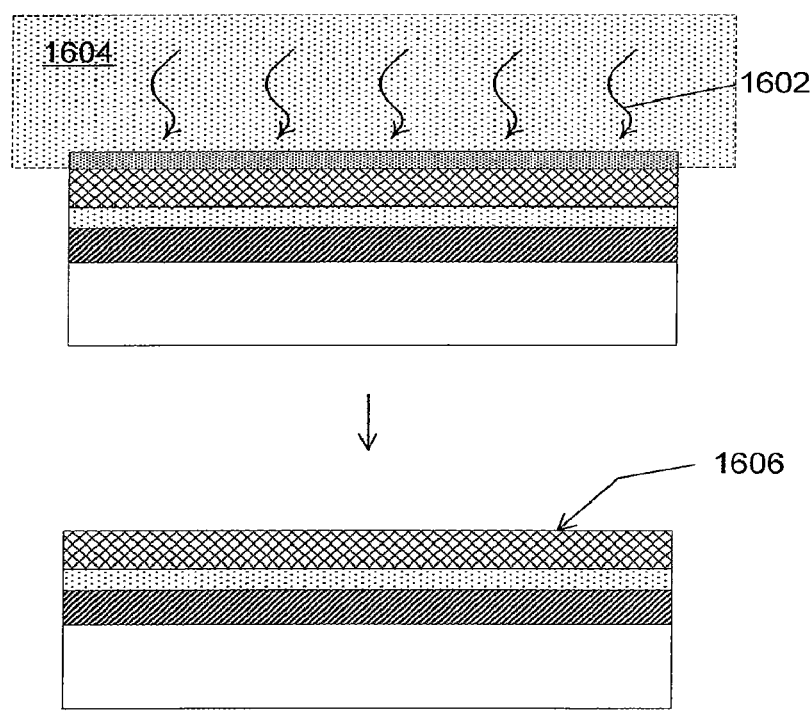

As shown in FIG. 16, the copper sulfide material is subjected to a dip process 1602. The dip process is performed by exposing the surface region of the copper sulfide material to a solution 1604 comprising potassium cyanide as an etching species at a concentration of about a 10% by weight according to a specific embodiment. Potassium cyanide solution provides an etching process to selectively remove copper sulfide material from the copper indium disulfide material surface exposing a surface region 1606 of underlying copper indium disulfide material according to a specific embodiment. In a preferred embodiment, the etching process has a selectivity of about 1:100 or more between copper sulfide and copper indium disulfide. Other etching species can be used depending on the embodiment. In a specific embodiment, the etching species can be hydrogen peroxide. In other embodiments, other etching techniques including electro-chemical etching, plasma etching, sputter-etching, or any combination of these may be used. In a specific embodiment, the copper sulfide material can be mechanically removed, chemically removed, electrically removed, or any combination of these, and others In a specific embodiment, the absorber layer made of copper indium disulfide can have a thickness ranging from about one micron to about 10 microns, but can be others. Of course, there can be other variations, modifications, and alternatives.

Figure 17:
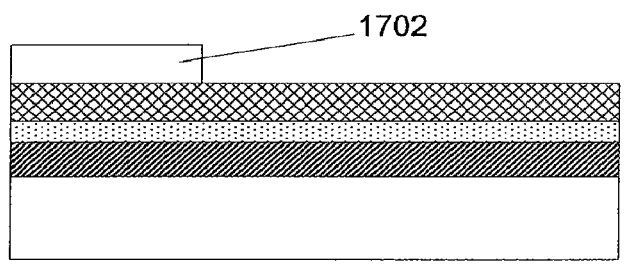

In a specific embodiment, the copper indium disulfide film has a p type impurity characteristics and provide for an absorber layer for the thin film photovoltaic cell. In certain embodiments, the copper indium disulfide material is further subjected to a doping process to adjust a p-type impurity density therein to optimize an I-V characteristic of the high efficiency thin film photovoltaic devices. For example, the copper indium disulfide material may be doped using an aluminum species. In another example, the copper indium disulfide material can be intermixed with a copper indium aluminum disulfide material to form the absorber layer. The window layer and the absorber layer forms an interface region for a PN-junction associated with a photovoltaic cell. Of course, there can be other variations, modifications, and alternatives As shown in FIG. 17, the method forms a second electrode layer 1702 overlying the absorber layer. The second electrode layer can be a transparent conductive oxide (TCO) in a specific embodiment. For example, the transparent conductive oxide can be selected from a group consisting of $In_2O_3$:Sn (ITO), ZnO:Al (AZO), SnO2:F (TFO), but can be others. In certain embodiments, the second electrode layer may be provided using a metal material such as tungsten, gold, silver, copper or others. In other embodiments, the second electrode layer can be reflective to reflect electromagnetic radiation back to the photovoltaic cell and improves the conversion efficiency of the photovoltaic cell. Of course there can be other variations, modifications, and alternatives.

In a specific embodiment, the method includes coupling the top cell and the bottom cell to form the thin film tandem cell as illustrated in FIG. 1. In a specific embodiment, the top cell and the bottom cell may be coupled using a suitable optical transparent material such as ethyl vinyl acetate but can be others depending on the application. Of course, there can be other variations, modifications, and alternatives. In a specific embodiment, other substrate configurations are described below.

Figure 18:
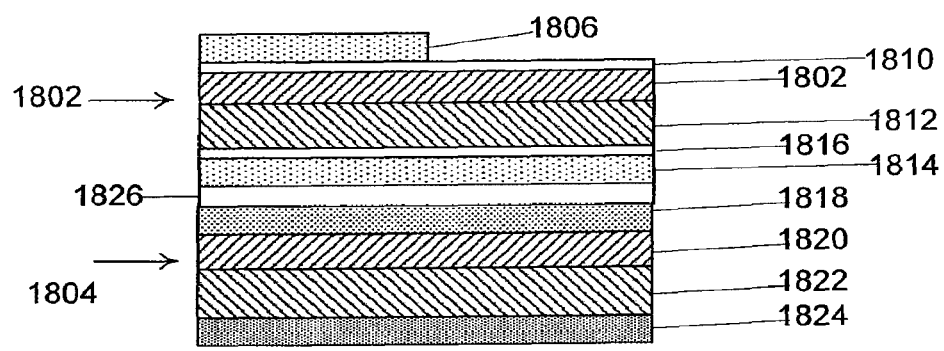
FIG. 18 is a simplified diagram illustrating a structure for a thin film tandem photovoltaic cell according to an embodiment of the present invention.
Figure 19:
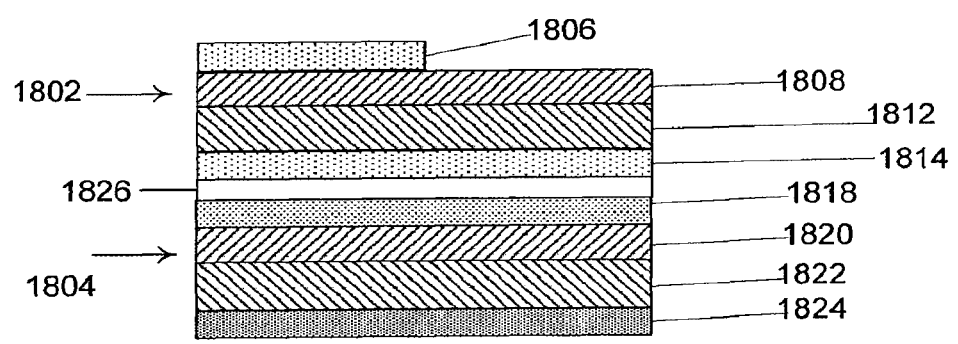
FIG. 19 is a simplified diagram illustrating an alternative structure for a thin film tandem photovoltaic cell according to an embodiment of the present invention.

FIGS. 18 and 19 are simplified diagrams illustrating structures of a tandem photovoltaic cell according to embodiments of the present invention. As shown in FIG. 18, a structure for a tandem photovoltaic cell is provided includes a top cell 1802 and a bottom cell 1804. The top cell can be a bifacial cell in a specific embodiment. The top cell includes a top first transparent conductive oxide material 1806. The top first transparent conductive oxide (TCO) material can include materials such as indium tin oxide (ITO), aluminum doped zinc oxide (ZnO:Al), Fluorine doped tin oxide ($SnO_2$:F), or others. The top cell includes a top window material 1802 underlying the first transparent conductive oxide material. In a specific embodiment, the top window material uses an n type semiconductor thin film material such as cadmium sulfide (CdS), zinc sulfide (ZnS), zinc selenium (ZnSe), zinc oxide (ZnO), or zinc magnesium oxide (ZnMgO), but can be others. The n type semiconductor material is preferably heavily doped to have a n+ type impurity characteristic. Of course there can be other variations, modifications, and alternatives.

Referring again to FIG. 18, the top cell includes a first interface region 1810 disposed between the top first transparent conductive oxide and the top window material. The first interface region is maintained substantially free from one or more entities from a diffusion of the top first transparent conductive oxide material into the top window material. Depending upon the embodiment, the barrier layer has suitable conductive characteristics and can be optically transparent. Of course, there can be other variations, modifications, and alternatives.

The top cell includes a top absorber material 1812 underlying the top window layer. The top absorber material has a p type impurity characteristic in a preferred embodiment. In a specific embodiment, the top absorber material comprises at least a top absorber material underlying the top window material, the top absorber material comprising a copper species, an indium species, and a sulfur species in a specific embodiment. In certain embodiment, the top absorber material can include a copper indium disulfide thin film material, copper indium aluminum disulfide thin film material, a copper indium gallium disulfide material, or a (Ag,Cu)(In,Ga)S$_2$ material, but can also be others, depending on the application. Of course, there can be other variations, modifications, and alternatives.

As shown in FIG. 18, the top cell includes a top second transparent conductive oxide material 1814 underlying the top absorber material. The second top second transparent conductive oxide material can include materials such as indium tin oxide (ITO), aluminum doped zinc oxide (ZnO: Al), Fluorine doped tin oxide (SnO$_2$:F), or others, depending on the embodiment.

In a specific embodiment, the top cell includes a second interface region 1816 dispose between the top second transparent conductive oxide and the top absorber material. The second interface region is maintained substantially free from one or more entities from a diffusion of the top second TCO material into the top absorber material. Depending upon the embodiment, the barrier layer has suitable conductive characteristics and can be optically transparent. Of course, there can be other variations, modifications, and alternatives.

Referring to again to FIG. 18. Bottom cell 1804 includes a bottom first transparent conductive oxide material 1818. The bottom first transparent conductive oxide (TCO) material can include materials such as indium tin oxide (ITO), aluminum doped zinc oxide (ZnO:Al), Fluorine doped tin oxide (SnO$_2$: F), or others. The bottom cell includes a bottom window material 1820 underlying the bottom first transparent conductive oxide material. In a specific embodiment, the bottom window material uses an n type semiconductor thin film material such as cadmium sulfide (CdS), zinc sulfide (ZnS), zinc selenium (ZnSe), zinc oxide (ZnO), or zinc magnesium oxide (ZnMgO), but can be others. The n type semiconductor material is preferably heavily doped to have a n+ type impurity characteristic. Of course there can be other variations, modifications, and alternatives.

The bottom cell includes a bottom absorber material 1822 underlying the window layer. The bottom absorber material has a p type impurity characteristic in a preferred embodiment. In a specific embodiment, the bottom absorber material comprises at least a copper species, an indium species, and a sulfur species in a specific embodiment. In certain embodiment, the bottom absorber material can include a copper indium disulfide thin film material, copper indium aluminum disulfide thin film material, or a copper indium gallium disulfide material, but can also be others, depending on the application. In other embodiments, the bottom absorber material can be Cu$_2$SnS$_3$; Cu(In,Ga)Se$_2$; CuInSe$_2$; or FeSi$_2$. Of course, there can be other variations, modifications, and alternatives.

As shown in FIG. 18, the bottom cell includes a bottom electrode material 1824 underlying the bottom absorber material. The bottom electrode material can include a transparent conductive oxide material such as indium tin oxide (ITO), aluminum doped zinc oxide (ZnO:Al), Fluorine doped tin oxide (SnO$_2$:F), and the like. The bottom electrode material may also include a metal material such as copper, nickel, gold, tungsten and others, depending on the embodiment. In a specific embodiment the bottom electrode material is provided using a molybdenum material. Of course, there can be other variations, modifications, and alternatives.

In a specific embodiment, the tandem thin film photovoltaic cell includes a coupling material 1826 provided between the top cell and the bottom cell. The coupling material is preferably an optically transparent material and free from a parasitic junction between the top cell and the bottom cell in a specific embodiment. In a specific embodiment, the optically transparent material can include material such as ethyl vinyl acetate and the like. Of course, there can be other variations, modifications, and alternatives.

Depending on the embodiment, the first interface region and the second interface region for the top cell can be optional. That is, the top cell is configured to have the top window material to underlie the top first transparent conductive oxide and the top second transparent conductive oxide to underlie the top absorber material as shown in FIG. 19. Of course there can be other variations, modifications, and alternatives.

Figure 20:
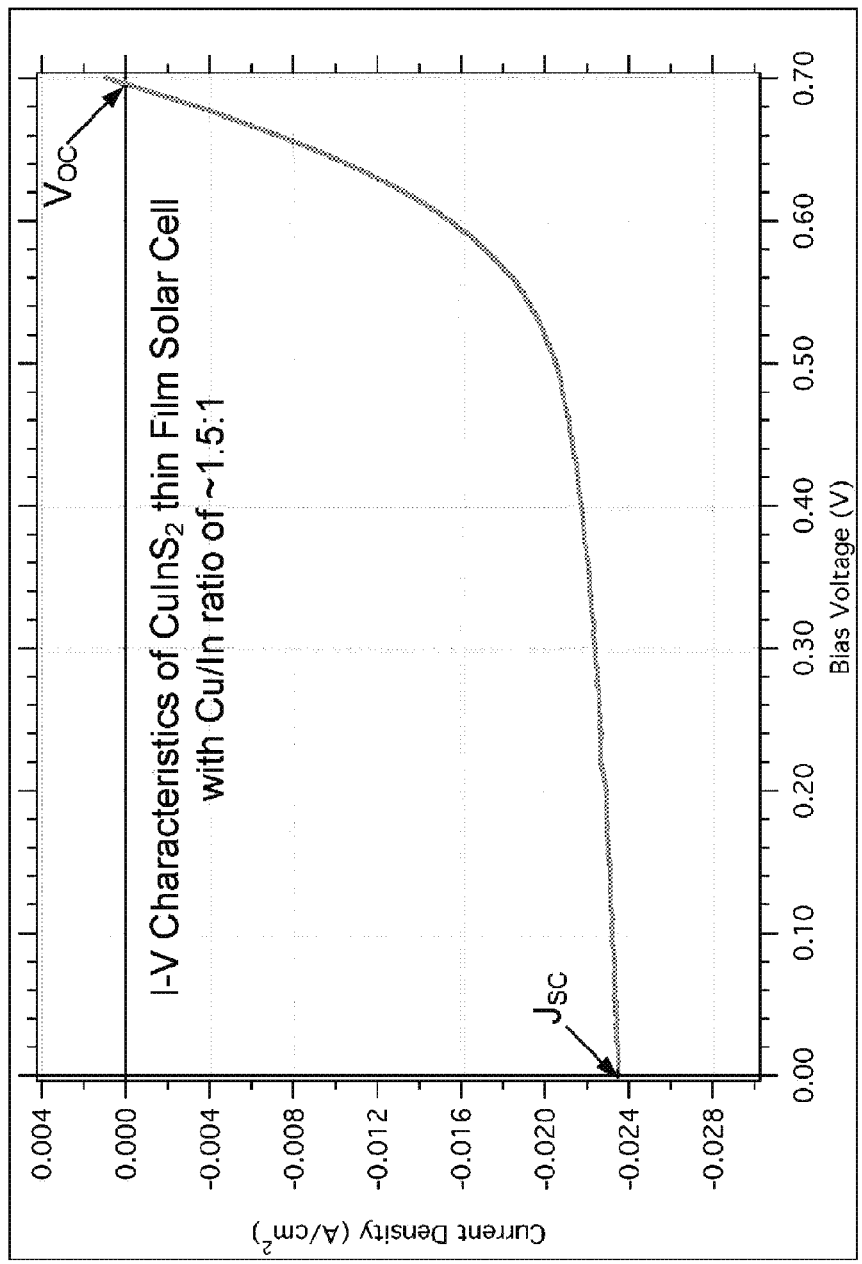
FIG. 20 is a simplified diagram illustrating a test result for a thin film tandem photovoltaic cell according to an embodiment of the present invention.

FIG. 20 is an exemplary solar cell I-V characteristics plot measured from a copper indium disulfide based thin film photovoltaic cell according to an embodiment of the present invention. The diagram is merely an example, which should not unduly limit the claims herein. One skilled in the art would recognize other variations, modifications, and alternatives. As shown in FIG. 20, a current density of a high efficiency copper indium disulfide thin film photovoltaic cell made according to an embodiment of the present invention is plotted against a bias voltage. Further details of the thin film photovoltaic cell and the experimental results are described in PCT Application No.: PCT/US09/46161 filed Jun. 3, 2009, commonly assigned, and hereby incorporate by reference. The curve intersects the y-axis with a short circuit current value at about 0.0235 A/cm$^2$ and intersects a zero current line with a bias at about 0.69 V. The corresponding photovoltaic cell has an absorber layer made from copper indium disulfide thin film according to an embodiment of the present invention. In particular, the absorber layer is about 1.5 μm in thickness and an atomic ratio of Cu:In at about 1.5:1. Based on standard formula, a cell conversion efficiency η can be estimated:

$$\eta = \frac{J_{SC} \cdot V_{OC} \cdot FF}{P_{in}(AM1.5)}$$

where $J_{SC}$ is the short circuit current density of the cell, $V_{OC}$ is the open circuit bias voltage applied, FF is the so-called fill factor defined as the ratio of the maximum power point divided by the open circuit voltage (Voc) and the short circuit current ($J_{SC}$). The input light irradiance ($P_{in}$, in W/m$^2$) under standard test conditions [i.e., STC that specifies a temperature of 25° C. and an irradiance of 1000 W/m2 with an air mass 1.5 (AM1.5) spectrum.] and the surface area of the solar cell (in m$^2$). Thus, a 10.4% efficiency can be accurately estimated for this particular cell made from a method according to embodiments of the present invention. In a specific embodiment, the bandgap is about 1.45 eV to 1.5 eV. Of course, there can be other variations, modifications, and alternatives.

Although the above has been illustrated according to specific embodiments, there can be other modifications, alternatives, and variations. For example, the method can be used to fabricate a photovoltaic cell that has an absorber layer that forms using a high temperature process. Although the above has been described in terms of a specific absorber material, other absorber materials such as Cu(InAl)S$_2$ Cu(InGa)S$_2$, Cu$_2$SnS, Cu$_2$ZnSnS$_4$, SnS, any combinations of these, and others can be used. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a tandem photovoltaic cell, comprising:
    forming a bifacial top cell, comprising:
       providing a top first transparent conductive oxide material;
       forming a top window material underlying the top first transparent conductive oxide material;
       forming a first interface region between the top window material and the top first transparent conductive oxide material, the first interface region being substantially free from one or more entities from the top first transparent conductive oxide material being diffused into the top window material;
       forming a top absorber material underlying the top window material, the top absorber material comprising a copper species, an indium species;
       subjecting the top absorber material to a thermal treatment process in a sulfur-containing environment, wherein the thermal treatment process includes a temperature ramp rate ranging from about 10 degrees Celsius/second to about 50 degrees Celsius/second;
       forming a top second transparent conductive oxide material underlying the top absorber material;
       forming a second interface region between the top second transparent conductive oxide material and the top absorber material, the second interface region being substantially free from one or more entities from the top first transparent conductive oxide material being diffused into the top absorber material, wherein the second interface region comprises at least one material selected from the group consisting of platinum, titanium, chromium, and silver;
    forming a bottom cell, comprising:
       forming a bottom first transparent conductive oxide material;
       forming a bottom window material underlying the first bottom transparent conductive oxide material;
       forming a bottom absorber material underlying the bottom window material;
       forming a bottom electrode material underlying the bottom absorber material; and
    forming a coupling layer between the bifacial top cell and the bottom cell, the coupling layer being free from a parasitic junction between the bifacial top cell and the bottom cell.

2. The method of claim 1 wherein the first transparent conductive oxide comprises indium tin oxide (ITO), aluminum doped zinc oxide (ZnO:Al), or Fluorine doped tin oxide (SnO$_2$:F).

3. The method of claim 1 wherein the top window material comprises cadmium sulfide (CdS), zinc sulfide (ZnS), zinc selenium (ZnSe), zinc oxide (ZnO), or zinc magnesium oxide (ZnMgO).

4. The method of claim 1 wherein the top absorber material comprises copper indium disulfide (CIS), copper indium aluminum disulfide, copper indium gallium disulfide (CIGS), or (Ag,Cu)(In,Ga)S2.

5. The method of claim 1 wherein the top second transparent conductive oxide material comprises cadmium sulfide (CdS), zinc sulfide (ZnS), zinc selenium (ZnSe), zinc oxide (ZnO), or zinc magnesium oxide (ZnMgO).

6. The method of claim 1 wherein the bottom first transparent conductive oxide material comprises cadmium sulfide (CdS), zinc sulfide (ZnS), zinc selenium (ZnSe), zinc oxide (ZnO), or zinc magnesium oxide (ZnMgO).

7. The method of claim 1 wherein the bottom window material comprises cadmium sulfide (CdS), zinc sulfide (ZnS), zinc selenium (ZnSe), zinc oxide (ZnO), or zinc magnesium oxide (ZnMgO).

8. The method of claim 1 wherein the bottom electrode material comprises a transparent conductive oxide material or a metal material.

9. The method of claim 1 wherein the bottom absorber material comprises a copper indium disulfide thin film material, a copper indium aluminum disulfide thin film material, or a copper indium gallium disulfide material.

10. The method of claim 1 wherein the bottom absorber material comprises Cu$_2$SnS$_3$; Cu(In,Ga)Se$_2$; CuInSe$_2$; or FeSi$_2$.

11. The method of claim 1 wherein the coupling layer comprises an optically transparent material.

12. The method of claim 1 wherein the coupling layer comprises ethyl vinyl acetate.

13. A method for fabricating a tandem photovoltaic cell, comprising:
    forming a bifacial top cell, comprising:
       providing a top first transparent conductive oxide material;
       forming a top window material underlying the top first transparent conductive oxide material;
       forming a first interface region between the top window material and the top first transparent conductive oxide material;
       forming a top absorber material underlying the top window material;
       subjecting the top absorber material to a thermal treatment process in a sulfur-containing environment, wherein the thermal treatment process includes a temperature ramp rate ranging from about 10 degrees Celsius/second to about 50 degrees Celsius/second;
       forming a top second transparent conductive oxide material underlying the top absorber material;
       forming a second interface region between the top second transparent conductive oxide material and the top absorber material, wherein the second interface region comprises at least one material selected from the group consisting of platinum, titanium, chromium, and silver;
    forming a bottom cell, comprising:
       forming a bottom absorber material underlying the bottom window material;

forming a bottom electrode material underlying the bottom absorber material; and forming a coupling layer between the bifacial top cell and the bottom cell.

14. The method of claim 13 wherein the top absorber material comprises copper indium disulfide (CIS), copper indium aluminum disulfide, copper indium gallium disulfide (CIGS), or (Ag,Cu)(In,Ga)S2.

15. The method of claim 13 wherein the bottom absorber material comprises a copper indium disulfide thin film material, a copper indium aluminum disulfide thin film material, or a copper indium gallium disulfide material.

16. The method of claim 13 wherein the bottom absorber material comprises $Cu_2SnS_3$; $Cu(In,Ga)Se_2$; $CuInSe_2$; or $FeSi_2$.

17. The method of claim 13 wherein the coupling layer comprises ethyl vinyl acetate.

18. The method of claim 13 wherein the first transparent conductive oxide comprises indium tin oxide (ITO), aluminum doped zinc oxide (ZnO:Al), or Fluorine doped tin oxide ($SnO_2$:F).

19. The method of claim 13 wherein the top window material comprises cadmium sulfide (CdS), zinc sulfide (ZnS), zinc selenium (ZnSe), zinc oxide (ZnO), or zinc magnesium oxide (ZnMgO).

20. The method of claim 13 wherein the top second transparent conductive oxide material comprises cadmium sulfide (CdS), zinc sulfide (ZnS), zinc selenium (ZnSe), zinc oxide (ZnO), or zinc magnesium oxide (ZnMgO).

* * * * *